(12) United States Patent
Burton et al.

(10) Patent No.: US 12,411,162 B2
(45) Date of Patent: Sep. 9, 2025

(54) ELECTROMAGNETIC FIELD DETECTOR

(71) Applicant: BRITISH TELECOMMUNICATIONS PUBLIC LIMITED COMPANY, London (GB)

(72) Inventors: Fraser Burton, London (GB); Marco Menchetti, London (GB); Liam Bussey, London (GB); Amelia Lees, London (GB)

(73) Assignee: BRITISH TELECOMMUNICATIONS public limited company, London (GB)

( * ) Notice: Subject to any disclaimer, the term of this patent is extended or adjusted under 35 U.S.C. 154(b) by 0 days.

(21) Appl. No.: 19/101,952

(22) PCT Filed: Jul. 11, 2023

(86) PCT No.: PCT/EP2023/069159
§ 371 (c)(1),
(2) Date: Feb. 7, 2025

(87) PCT Pub. No.: WO2024/032997
PCT Pub. Date: Feb. 15, 2024

(65) Prior Publication Data
US 2025/0258211 A1    Aug. 14, 2025

(30) Foreign Application Priority Data
Aug. 10, 2022   (EP) ..................... 22189677

(51) Int. Cl.
*G01R 29/08*   (2006.01)
*H04B 10/2575*   (2013.01)

(52) U.S. Cl.
CPC ..... *G01R 29/0885* (2013.01); *G01R 29/0892* (2013.01); *H04B 10/25752* (2013.01); *H04B 2210/006* (2013.01)

(58) Field of Classification Search
CPC ............ G01R 29/0885; G01R 29/0892; H04B 10/25752; H04B 2210/006
(Continued)

(56) References Cited

U.S. PATENT DOCUMENTS

| 5,278,499 A | * | 1/1994 | Ito .................. G01R 33/032 356/477 |
| 5,907,426 A | * | 5/1999 | Kato ................ G01R 29/0885 359/239 |

(Continued)

FOREIGN PATENT DOCUMENTS

| CN | 103955963 A | 7/2014 |
| CN | 205691490 U | 11/2016 |

(Continued)

OTHER PUBLICATIONS

Christopher L. Holloway et al., "Detecting and Receiving Phase Modulated Signals with a Rydber Atom-Based Mixer", Mar. 27, 2019 (5 pages).

(Continued)

*Primary Examiner* — Christopher P Mcandrew
(74) *Attorney, Agent, or Firm* — Nixon & Vanderhye P.C.

(57) ABSTRACT

This invention provides an electromagnetic field detector, a system comprising the electromagnetic field detector, and a method of operating an electromagnetic field detector, the electromagnetic field detector comprising a first optical signal interface configured to receive, from one or more remote optical sources, a first optical signal; an electromagnetic field transmitter configured to transmit a local oscillator electromagnetic field generated from the first optical signal, the electromagnetic field transmitter comprising: a photocurrent generator configured to generate a photocurrent from the first optical signal; and an antenna interface configured to supply the photocurrent to an antenna to (Continued)

transmit the local oscillator electromagnetic field; a second optical signal interface configured to receive, from the one or more remote optical sources, a probe optical signal and a coupling optical signal; and a transmission medium configured to be excited by the probe optical signal and further excited by the coupling optical signal, wherein the probe optical signal has a probe frequency set to excite electrons of the transmission medium to a first excited state and the coupling optical signal has a coupling frequency set to excite electrons of the transmission medium to a predetermined Rydberg state so as to induce an Electromagnetic Induced Transparency, EIT, effect, wherein the transmission medium is further configured to receive a phase-modulated electromagnetic field from a remote transmitter and the local oscillator electromagnetic field such that the combination of the phase-modulated electromagnetic field and the local oscillator electromagnetic field causes a change in the probe optical signal from which a phase state of the phase-modulated electromagnetic field can be detected.

18 Claims, 3 Drawing Sheets

(58) Field of Classification Search
USPC .................................................. 324/244.1
See application file for complete search history.

(56) References Cited

U.S. PATENT DOCUMENTS

| | | | |
|---|---|---|---|
| 5,991,036 A * | 11/1999 | Frankel | G01V 8/005 356/478 |
| 6,826,339 B1 | 11/2004 | Mueller | |
| 7,773,887 B2 | 8/2010 | Lee et al. | |
| 7,920,263 B2 * | 4/2011 | Wu | G01R 31/308 324/96 |
| 9,500,771 B2 | 11/2016 | Liu et al. | |
| 10,095,659 B2 * | 10/2018 | Katz | G06F 17/00 |
| 10,416,213 B2 * | 9/2019 | Pathak | H01L 23/576 |
| 10,509,065 B1 | 12/2019 | Shaffer | |
| 10,763,966 B1 | 9/2020 | Deb et al. | |
| 10,979,147 B2 | 4/2021 | Gordon et al. | |
| 11,069,952 B2 * | 7/2021 | Keller, III | G01R 31/002 |
| 11,402,479 B1 | 8/2022 | Pecen et al. | |
| 11,489,847 B1 * | 11/2022 | Uplinger, II | H04L 63/1441 |
| 11,977,107 B1 | 5/2024 | Yu et al. | |
| 2005/0168741 A1 * | 8/2005 | Banks | G01N 21/645 356/417 |
| 2010/0123453 A1 * | 5/2010 | Pauly | G01R 29/0871 324/76.11 |
| 2011/0095755 A1 | 4/2011 | Maki | |
| 2016/0363617 A1 | 12/2016 | Anderson et al. | |
| 2019/0187198 A1 | 6/2019 | Anderson et al. | |
| 2020/0136727 A1 | 4/2020 | Graceffo et al. | |
| 2020/0233025 A1 | 7/2020 | Salim et al. | |
| 2020/0295838 A1 | 9/2020 | Gordon et al. | |
| 2020/0400965 A1 * | 12/2020 | Kirkham | G01J 1/4257 |
| 2021/0048465 A1 | 2/2021 | Anderson et al. | |
| 2021/0091819 A1 | 3/2021 | Asuri et al. | |
| 2021/0096206 A1 * | 4/2021 | Frankel | G01R 31/311 |
| 2021/0250101 A1 | 8/2021 | Gordon et al. | |
| 2022/0196716 A1 | 6/2022 | Anderson et al. | |

FOREIGN PATENT DOCUMENTS

| | | |
|---|---|---|
| CN | 104714110 B | 9/2017 |
| CN | 107179450 A | 9/2017 |
| CN | 107462849 A | 12/2017 |
| CN | 106124856 B | 10/2018 |
| CN | 108809341 A | 11/2018 |
| CN | 108927314 A | 12/2018 |
| CN | 109142891 A | 1/2019 |
| CN | 109342830 A | 2/2019 |
| CN | 109905177 A | 6/2019 |
| CN | 110518985 A | 11/2019 |
| CN | 112098736 | 12/2020 |
| CN | 112867934 | 5/2021 |
| CN | 113504415 A | 10/2021 |
| CN | 113514698 A | 10/2021 |
| CN | 114424111 | 4/2022 |
| CN | 115032464 A | 9/2022 |
| CN | 115184693 A | 10/2022 |
| CN | 117871969 A | 4/2024 |
| EP | 3308146 A1 | 4/2018 |
| EP | 3522789 A1 | 8/2019 |
| EP | 3522789 B1 | 8/2019 |
| GB | 2588754 A | 5/2021 |
| GB | 2605123 A | 9/2022 |
| GB | 2606167 A | 11/2022 |
| WO | 2018103897 A1 | 6/2018 |
| WO | 2019048482 A1 | 3/2019 |
| WO | 2021078438 A1 | 4/2021 |
| WO | 2021184933 A1 | 9/2021 |
| WO | 2021243260 A1 | 12/2021 |
| WO | 2021244661 A1 | 12/2021 |
| WO | 2022017679 A1 | 1/2022 |

OTHER PUBLICATIONS

Zhenfei Song et al., "Rydberg-atom-based digital communication using a continuously tunable radio-frequency carrier" Optics Express, vol. 27, No. 6, Mar. 18, 2019 (10 pages).

Matthew T. Simons, "A Rydberg Atom-Based Mixer: Measuring the Phase of a Radio Frequency Wave" Appl. Phys. Lett. 114, 114101 (2019) NIST https://doi.org/10.1063/1.5088821 (4 pages).

Christopher L. Holloway et al., "Detecting and Receiving Phase-Modulated Signals With a Rydberg Atom-Based Receiver", IEEE Antennas and Wireless Propagation Letters, vol. 18, No. 9, Sep. 2019 (5 pages).

Ulrik Gliese et al., "Multifunctional Fiber-Optic Microwave Links Based on Remote Heterodyne Detection", IEEE Transactions on Microwave Theory and Techniques, vol. 46, No. 5, May 1998 (11 pages).

A. Garcia-Juarez et al., "Optical heterodyne technique for generating and distributing microwave signals" Proceedings of SPIE—The International Society for Optical Engineering • Jan. 2010 (6 pages).

G. Epple et al., "Rydberg atoms in hollow-core photonic crystal fibres" Nature Communications, Published Jun. 19, 2014 (5 pages).

D. Wake et al., "Zero-bias edge-coupled InGaAs photodiodes in millimetre-wave radio-fibre systems" Electronics letters, vol. 29, Issue 21, Oct. 14, 1993, p. 1879-1881 (3 pages).

Christopher L. Holloway, "A Multiple-Band Rydberg-Atom Based Receiver/Antenna: AM/FM Stereo Reception", National Institute of Standards and Technology (NIST) and Institute for Telecommunication Sciences (ITS), Mar. 2, 2019 (10 pages).

D. A. Anderson et al., "An atomic receiver for AM and FM radio communication", Rydberg Technologies, Ann Arbor, MI and Department of Physics, Univ. of Michigan, Aug. 26, 2018 (6 pages).

Matt T Simons et al, "Fiber-coupled vapour cell for a portable Rydberg atom-based radio frequency electric field sensor", applied optics, vol. 57, No. 22, Aug. 1, 2018 (5 pages).

A. I. Hernandez-Serrano et al., "Artificial dielectric stepped-refractive-index lens for the terahertz region", Optics Express, vol. 26, No. 3, Feb. 5, 2018 (7 pages).

Christopher L. Holloway et al., "A Multiple-Band Rydberg-Atom Based Receiver/Antenna: AM/FM Stereo Reception", arxiv.org, Cornell University Library, 201 Olin Library Cornell University Ithaca, NY14853, Mar. 2, 2019 (Mar. 2, 2019), XP081125249, cited in the application the whole document (10 pages).

Combined Search and Examination Report for GB2211667.7 Dated Jan. 24, 2023 (6 pages).

David H. Meyer et al., "Assessment of Rydberg Atoms for Wideband Electric Field Sensing" , arxiv.org, Cornell University Library, 20lOLIN Library Cornell University Ithaca, NY 14853, Oct. 1, 2019 (Oct. 1, 2019), XP081575866, DOI: 10.1088/1361-6455/

(56) References Cited

OTHER PUBLICATIONS

AB6051 p. 9, right-hand column paragraph 3—p. 11, right-hand column, paragraph 2; figures 1-5 (16 pages).
Matthew T. Simons et al., "Embedding a Rydberg Atom-Based Sensor Into an Antenna for Phase and Amplitude Detection of Radio-Frequency Fields and Modulated Signals" IEEE Access, vol. 7, 2019, published Oct. 22, 2019 (11 pages).
Extended European Search Report For 19205106.8 Dated Apr. 29, 2020 (6 pages).
Extended European Search Report for EP 24179958.4 dated Nov. 5, 2024 (9 pages).
Examination Report for EP20765052.4 Dated Aug. 16, 2022 (4 pages).
G. M Brodnik et al., "Widely Tunable Optical Local Oscillator Scheme for RF Photonic Down-Conversion," 2019 IEEE Avionics and Vehicle Fibre-Optics and Photonics Conference (AVFOP), Arlington, VA, USA, 2019, pp. 1-2. see whole document, but particularly Abstract and Fig 2 (2 pages).
GB Combined Search & Exam Report for GB2105981.1 dated Sep. 16, 2021 (8 pages).
GB Combined Search & Exam Report for GB2010995.5 dated Apr. 9, 2021 (12 pages).
GB Combined Search and Examination Report For 1915420.2 Dated Apr. 22, 2020 (6 pages).
GB Search Report For 2216601.1 Dated May 2, 2023 (4 pages).
Christopher L. Holloway et al., "Development and Applications of a Fiber-Coupled Atom-Based Electric Field Probe", 2018 International Symposium on Electromagnetic Compatibility (EMC Europe), IEEE, Aug. 27, 2018 (Aug. 27, 2018), pp. 381-385, XP0334 I6148, DOI: 10 1109/EMCEUROPE 2018 8485006 [retrieved on Oct. 5, 2018] (5 pages).
International Preliminary Report on Patentability for PCT/EP2022/053845 Dated Sep. 14, 2023 (13 pages).
International Preliminary Report on Patentability for PCT/EP2022/055577 Dated Jul. 24, 2023 (8 pages).
International Preliminery Report on Patentability for PCT/EP2020/075070 Dated May 5, 2022 (8 pages).
International Search Report & Written Opinion for PCT/EP2022/055577 dated Jul. 15, 2022 (13 pages).
International Search Report & Written Opinion for PCT/EP2022/053845 dated May 16, 2022 (16 pages).
International Search Report and Written Opinion for PCT/EP2021/065655 dated Aug. 23, 2021 (15 pages).
Christopher L. Holloway et al., International Symposium on Electromagnetic Compatability, 2018, "Development and Applications of a Fiber-Coupled Atom-Based Electric Field Probe", Aug. 27-30, 2018, pp. 381-385 Introduction, Description of the atom based approach (5 pages).
Santosh Kumar et al., "Atom-Based Sensing of Weak Radio Frequency Electric Fields Using Homodyne Readout" Scientific Reports, vol. 7, No. 1, Mar. 1, 2017 (Mar. 1, 2017), XP055852818, DOI: 10.1038/srep42981 Retrieved from the Internet:URL:https://www.nature.com/articles/srep42 981.pdf p. 1, paragraph 1—p. 8, paragraph I', figures 1-6 (10 pages).
Kai Yang et al., "Local oscillator port embedded field enhancement resonator for Rydberg atomic heterodyne technique", EPJ Quantum Technology, (2023) (13 pages).
L. Ma et al., "Paschen-Back effect and Rydberg-state diamagnetism in vapor-cell electromagnetically induced transparency", arxiv.org, Cornell University Library, 201 Olin Library Cornell University Ithaca, NY 14853,Feb. 18, 2017 (Feb. 18, 2017), XP080956293, DOI: 10.1103/PHYSREVA.95.061804p. 1, left-hand column, paragraph 1—p. 5, right-hand column last paragraph; figures 1-5 (6 pages).
Matt T. Simons et al., "Fiber-coupled vapor cell for a portable Rydberg atom-based radio frequency electric field sensor", Applied Optics, vol. 57, No. 22, Jul. 26, 2018 (Jul. 26, 2018), p. 6456, XP055686761, ISSN: 1559-128X, DOI: 10.1364/A0.57.006456 (5 pages).
Office Action for CN202080066526.3 Dated Jul. 7, 2022 (6 pages).
PCT/EP2020/075070 International Search Report and Written Opinion dated Dec. 15, 2020 (12 pages).
Christopher L. Holloway et al., "Rydberg atom-based field sensing enhancement using a split-ring resonator", Applied Physics Letters, Research Article, May 20, 2022 (7 pages).
Search Report for GB2202067.1 Dated Jul. 13, 2022 (4 pages).
The Extended European Search Report for EP22206146.7 Dated Apr. 18, 2023 (7 pages).
The Extended Search Report for EP22189677.2 Dated Feb. 7, 2023 (8 pages).
The International Preliminary Report on Patentability for PCT/EP2021/065655 Dated Jul. 29, 2022 (7 pages).
The International Search Report and the Written Opinion for PCT/EP2023/069159 Dated Sep. 20, 2023 (14 pages).
Written Opinion of the International Preliminary Examining Authority for PCT/EP2022/055577 dated May 16, 2023 (7 pages).
International Preliminary Report on Patentability dated Feb. 20, 2025 issued for International Application No. PCT/EP2023/069159 (9 pages).
First Notification of Office Action dated May 6, 2025 issued for Chinese Application No. 202380057432.3 (11 pages).

\* cited by examiner

ELECTROMAGNETIC FIELD DETECTOR

CROSS-REFERENCE TO RELATED APPLICATIONS

This application is the U.S. national phase of International Application No. PCT/EP2023/069159 filed Jul. 11, 2023 which designated the U.S. and claims priority to EP 22189677.2 filed Aug. 10, 2022, the entire contents of each of which are hereby incorporated by reference.

FIELD OF THE INVENTION

The present invention relates to an electromagnetic field detector, a system comprising an electromagnetic field detector, and a method of operating an electromagnetic field detector.

BACKGROUND

A Rydberg atom is an atom with one or more electrons excited to a very high principal quantum number (e.g. >10). These Rydberg atoms have several useful properties, such as very large dipole moments and long decay periods.

The Rydberg atom may be used to detect an electromagnetic field. A Rydberg-atom based electromagnetic field detector is based on the Electromagnetically Induced Transparency (EIT) effect. The EIT effect may be experienced when a probe laser and a coupling laser are used to elevate electrons of an atomic medium to a Rydberg state. In this state, the atomic medium becomes transparent to the probe laser. An electromagnetic field incident at the atomic medium may then cause a further transition of an electron from the Rydberg state to a further Rydberg state. Electrons may subsequently drop from the further Rydberg state to the ground state so that the atomic medium becomes less transparent to the probe laser. The electromagnetic field may therefore be detected from this change in transparency as a change in intensity of the probe laser, thus creating a Rydberg-atom based AM RF receiver. A more detailed explanation of this effect can be found in the article, "A Multiple-Band Rydberg-Atom Based Receiver/Antenna: AM/FM Stereo Reception", Holloway et al., National Institute of Standards and Technology).

Furthermore, a Rydberg-atom based FM RF receiver works in a similar manner. That is, when the RF electric field changes (or "detunes") from its resonant RF transition frequency, the EIT signal (on a graph of the EIT signal against probe laser detuning) splits into two non-symmetrical peaks. The separation of the two peaks increases with RF detuning. By locking the probe laser and coupling laser to particular frequencies, then the optical detector output is directly correlated to the FM RF electric field. A more detailed explanation of this effect can also be found in article, "A Multiple-Band Rydberg-Atom Based Receiver/Antenna: AM/FM Stereo Reception", Holloway et al., National Institute of Standards and Technology) and in article, "Using frequency detuning to improve the sensitivity of electric field measurements via electromagnetically induced transparency and Autler-Townes splitting in Rydberg atoms" Appl. Phys. Lett. 108, 174101 (2016), Matt T. Simons.

Rydberg RF receivers may also be used to detect phase modulated RF fields, such as those of Binary Phase-Shift Keying (BPSK), Quadrature Phase-Shift Keying (QPSK), and Quadrature Amplitude Modulation (QAM) signals (used in many wireless and cellular communications protocols). In these modulation schemes, data is transmitted by modulating the phase of a carrier. To detect the carrier's phase, a reference RF field being on-resonance with the transition to the Rydberg state is applied to the atomic medium, which acts as a local oscillator. The difference frequency, or "intermediate frequency", is detected and the phase of the intermediate frequency signal corresponds directly to the relative phase between the local oscillator and the incident RF electric field. More detailed explanations of this effect can also be found in articles, "A Rydberg Atom-Based Mixer: Measuring the Phase of a Radio Frequency Wave", Appl. Phys. Lett. 114, 114101 (2019), Holloway et al. and "Detecting and Receiving Phase-Modulated Signals With a Rydberg Atom-Based Receiver", IEEE ANTENNAS AND WIRELESS PROPAGATION LETTERS, VOL. 18, NO. 9, September 2019, Holloway et al.

SUMMARY OF THE INVENTION

According to a first aspect of the invention, there is provided an electromagnetic field detector comprising a first optical signal interface configured to receive, from one or more remote optical sources, a first optical signal; an electromagnetic field transmitter configured to transmit a local oscillator electromagnetic field generated from the first optical signal, the electromagnetic field transmitter comprising: a photocurrent generator configured to generate a photocurrent from the first optical signal; and an antenna interface configured to supply the photocurrent to an antenna to transmit the local oscillator electromagnetic field; a second optical signal interface configured to receive, from the one or more remote optical sources, a probe optical signal and a coupling optical signal; and a transmission medium configured to be excited by the probe optical signal and further excited by the coupling optical signal, wherein the probe optical signal has a probe frequency set to excite electrons of the transmission medium to a first excited state and the coupling optical signal has a coupling frequency set to excite electrons of the transmission medium to a predetermined Rydberg state so as to induce an Electromagnetic Induced Transparency, EIT, effect, wherein the transmission medium is further configured to receive a phase-modulated electromagnetic field from a remote transmitter and the local oscillator electromagnetic field such that the combination of the phase-modulated electromagnetic field and the local oscillator electromagnetic field causes a change in the probe optical signal from which a phase state of the phase-modulated electromagnetic field can be detected.

The first optical signal interface may be further configured to receive a second optical signal from the one or more remote optical sources, and the photocurrent generator may be configured to generate the photocurrent by mixing the first and second optical signals.

The local oscillator electromagnetic field and the phase-modulated electromagnetic field may be synchronised.

The first optical signal may have a wavelength in one of the O-band, E-band, S-band, C-band, L-band, and U/XL-band. The second optical signal may have a wavelength in one of the O-band, E-band, S-band, C-band, L-band, and U/XL-band.

The local oscillator electromagnetic field may be dual-polarised.

The electromagnetic field detector may further comprise: a first module comprising the first optical signal interface and the electromagnetic field transmitter; and a second module comprising the second optical signal interface and the transmission medium.

The first module and second module may either embodied in a single housing or embodied in respective housings.

The second module may be one of a plurality of second modules, each second module may comprise: a respective second optical signal interface configured to receive, from the one or more remote optical sources, the probe optical signal and the coupling optical signal, and a respective transmission medium configured to be excited by the probe optical signal and further excited by the coupling optical signal, wherein the probe optical signal has a probe frequency set to excite electrons of the transmission medium to a first excited state and the coupling optical signal has a coupling frequency set to excite electrons of the respective transmission medium to a predetermined Rydberg state so as to induce an Electromagnetic Induced Transparency, EIT, effect, wherein the respective transmission medium may be further configured to receive a phase-modulated electromagnetic field from the remote transmitter and the local oscillator electromagnetic field from the electromagnetic field transmitter of the first module such that the combination of the phase-modulated electromagnetic field and the local oscillator electromagnetic field causes a change in the probe signal from which a phase state of the phase-modulated electromagnetic field can be detected.

The first module may be one of a plurality of first modules, each first module may comprise: a respective first optical signal interface configured to receive, from the one or more remote optical sources, the first optical signal, and a respective electromagnetic field transmitter configured to transmit a local oscillator electromagnetic field generated from the first optical signal, wherein each first module of the plurality of first modules may be associated with a second module of the plurality of second modules such that the local oscillator electromagnetic field transmitted by the respective electromagnetic field transmitter of that first module may be received at the transmission medium of the associated second module.

According to a second aspect of the invention, there is provided a system comprising: an electromagnetic field detector of the first aspect of the invention; and one or more optical sources, remote from the electromagnetic field detector, configured to generate the first optical signal, the probe optical signal and the coupling optical signal, and communicate the first optical signal, probe optical signal and coupling optical signal to the electromagnetic field detector.

The system may be part of a telecommunications network, wherein the one or more optical sources may be configured to receive a network-distributed synchronisation signal, and the one or more optical sources may be configured to synchronise the first optical signal based on the synchronisation signal.

The phase-modulated electromagnetic field may be synchronised with the network-distributed synchronisation signal.

The system may further comprise a master clock and a transmitter configured to communicate a synchronisation signal, derived from the master clock, to the remote transceiver, wherein the first optical signal may be synchronised to the synchronisation signal.

The system may further comprise an optical telecommunications network, wherein the first optical signal, probe optical signal and coupling optical signal may be communicated to the electromagnetic field detector via the optical telecommunications network.

According to a third aspect of the invention, there is provided a method of operating an electromagnetic field detector, the electromagnetic detector having a transmission medium, the method comprising the steps of: receiving, from one or more remote optical sources, a first optical signal; generating a photocurrent from the first optical signal; transmitting a local oscillator electromagnetic field generated from the first optical signal by supplying the photocurrent to an antenna; receiving, from the one or more remote optical sources, a probe optical signal and a coupling optical signal, wherein the transmission medium is excited by the probe optical signal having a probe frequency set to excite electrons of the transmission medium to a first excited state, and wherein the transmission medium is further excited by the coupling optical signal having a coupling frequency set to excite electrons of the transmission medium to a predetermined Rydberg state so as to induce an Electromagnetic Induced Transparency, EIT, effect;

and receiving, at the transmission medium, a phase-modulated electromagnetic field from a remote transmitter and the transmitted local oscillator electromagnetic field such that the combination of the phase-modulated electromagnetic field and the transmitted local oscillator electromagnetic field causes a change in the probe optical signal from which a phase state of the phase-modulated electromagnetic field can be detected.

The method may further comprise the step of: receiving, from the one or more optical sources, a second optical signal, wherein the step of generating the local oscillator electromagnetic field may further comprise mixing the first and second optical signals to generate the photocurrent.

The electromagnetic field detector may be an element of an electromagnetic field detector array, each element of the electromagnetic field detector array having a transmission medium, wherein the transmission medium of each element of the electromagnetic field detector array is excited by the probe optical signal and further excited by the coupling optical signal so as to induce the EIT effect in the transmission medium of each element of the electromagnetic field detector array, wherein the method may further comprise the steps of: receiving, at the transmission medium of each element of the electromagnetic field detector array, a phase-modulated electromagnetic field from the remote transmitter and the transmitted local oscillator electromagnetic field such that the combination of the phase-modulated electromagnetic field and the transmitted local oscillator electromagnetic field causes a change in the probe optical signal from which a phase state of the phase-modulated electromagnetic field can be detected.

BRIEF DESCRIPTION OF THE FIGURES

In order that the present invention may be better understood, embodiments thereof will now be described, by way of example only, with reference to the accompanying drawings in which.

DETAILED DESCRIPTION

Figure 1:
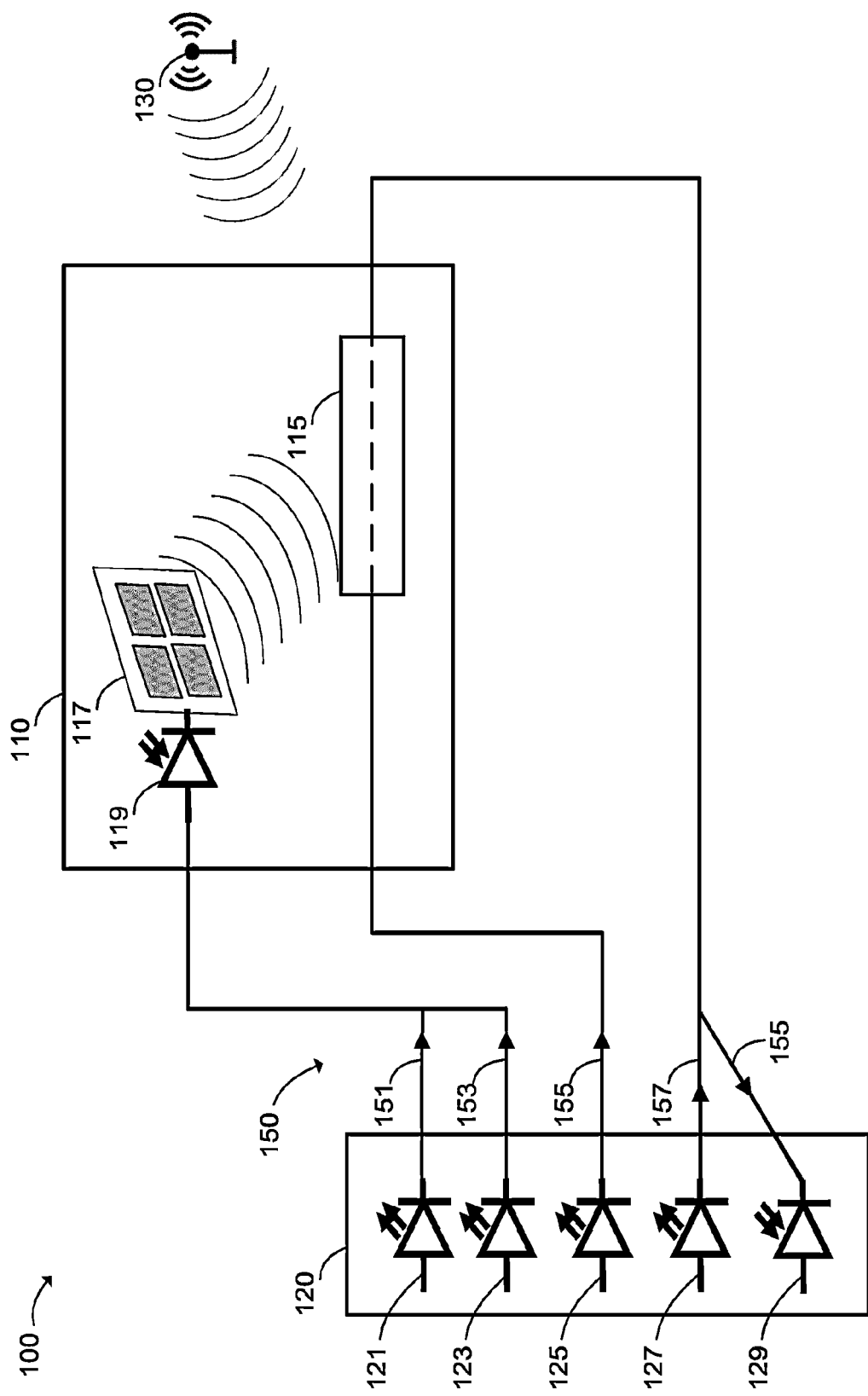
FIG. 1 is a schematic diagram illustrating a Rydberg-atom based RF detector.

FIG. 1 illustrates a wireless telecommunications network 100. The wireless telecommunications network 100 is a cellular telecommunications network operating according to the $5^{th}$ Generation (5G) protocol as defined by the $3^{rd}$ Generation Partnership Project (3GPP). The wireless telecommunications network 100 includes a Rydberg-atom based Radio Frequency (RF) receiver 110, an optical equipment housing 120 and a signal transmitter 130.

The optical equipment housing 120 includes a first optical source 121, a second optical source 123, a third optical source 125, a fourth optical source 127 and a photodetector 129. The first optical source 121 is a laser transmitter configured to produce a first optical signal. The second optical source 123 is also a laser transmitter configured to produce a second optical signal. Certain characteristics of these first and second optical signals—such as their wavelengths and corresponding frequencies—are configurable. In this example, the wavelengths of the first and second optical signals are 1550.01438 nm and 1549.98562 nm respectively, which corresponds with a frequency separation of 3.58894 GHz. As described below, the frequency to be detected by the Rydberg-atom based RF receiver 110 is 3.58891 GHz. The difference between the frequency to be detected by the Rydberg-atom based RF receiver 110 and the frequency separation of the first and second optical signals is therefore 30 KHz.

The third and fourth optical sources 125, 127 are also laser transmitters and are configured to produce a third optical signal (hereinafter the "probe" signal) and a fourth optical signal (hereinafter the "coupling" signal) respectively. The frequencies of the probe and coupling signals are configurable by the third and fourth optical sources 125, 127. The probe and coupling signals are discussed in more detail below.

The optical equipment housing 120 includes a phase noise reduction module (not shown) configured to reduce the difference in phase between the first and second optical signals. This is achieved by locking the first and second optical sources to an optical cavity or a frequency comb to achieve stable optical sources.

The first, second, third and fourth optical sources 121, 123, 125, 127 launch the first, second, probe, and coupling signals onto respective first, second, third and fourth optical fibres 151, 153, 155, 157 (collectively, a plurality of optical fibres 150). The plurality of optical fibres 150 connect the optical equipment housing 120 to the Rydberg-atom based RF receiver 110. The optical equipment housing 120 and the Rydberg-atom based RF receiver 110 are positioned remote from one another. The wavelengths of the first and second optical signals are within the "C-band" of optical communications such that they experience relatively low attenuation as they are communicated over the distance between the optical equipment housing 120 and the Rydberg-atom based RF receiver 110 using conventional optical fibre such as single-mode fibre. Furthermore, the difference between the wavelength of the first optical signal and the wavelength corresponding with the C-band's attenuation minimum (+0.01438 nm) is equal and opposite to the difference between wavelength of the second optical signal and the wavelength corresponding with the C-band's attenuation minimum (−0.01438 nm). This ensures that the first and second optical signals have equal attenuation.

The third and fourth optical fibres 155, 157—carrying the probe and coupling signals respectively—are speciality fibres (such as hollow core fibre) designed for low attenuation at the frequencies of the probe and coupling signals.

The plurality of optical fibres 150 may interface with an optical network to carry the first, second, probe and coupling signals to the Rydberg-atom based RF receiver 110.

The photodetector 129 is configured to receive the probe signal following its passage through the Rydberg-atom based RF receiver 110—as described below.

The signal transmitter 130, which may be, for example, a User Equipment (UE) such as a mobile telephone or an Internet of Things (IoT) transmitter, is configured to transmit wireless phase-modulated signals at 3.58891 GHz using a 16-QAM modulation scheme. The signal transmitter 130 is also configured to synchronise with a network-distributed synchronisation signal, such as the Primary and Secondary Synchronisation Signals (PSS, SSS) of the cellular telecommunications network. These synchronisation signals may be broadcast by a base station of the cellular telecommunications network (not shown).

The Rydberg-atom based RF receiver 110 is configured to detect the phase of each wireless phase-modulated signal transmitted by the signal transmitter 130 and therefore demodulate data encoded into a plurality of these phase-modulated signals. The Rydberg-atom based RF receiver 110 includes one or more optical fibre interfaces for receiving the plurality of optical fibres 150 from the optical equipment housing 120. The Rydberg-atom based RF receiver 110 also includes a transmission medium 115, such as a glass cell filled with an atomic vapour of Rubidium-85 atoms. The probe signal from the third optical fibre 155 passes through the transmission medium 115 and excites electrons of the Rubidium-85 atoms. The probe signal is thereafter carried by the third optical fibre 155 from the transmission medium 115 to the photodetector 129 in the optical equipment housing 120. The coupling signal passes through the transmission medium 115, (counter-propagating and overlapping the probe signal—indicated by the dashed line in FIG. 1) and also excites electrons of the Rubidium-85 atoms. The frequency of the probe signal is set to correlate with the transition of an electron of a Rubidium-85 atom from a ground state to a first excited state, and the frequency of the coupling signal is set to correlate with the transition of an electron of a Rubidium-85 atom from the first excited state to a predetermined Rydberg state. The predetermined Rydberg state is selected based on the specific frequencies of the probe and coupling signals so that a wireless phase-modulated signal (from the signal transmitter 130) having a particular frequency, incident upon the transmission medium 115, excites electrons from the predetermined Rydberg state to another Rydberg state causing a detectable change in the probe signal. In this example, in which the signal transmitter 130 transmits wireless signals at around 3.58891 GHz, the probe frequency is 780.2463 nm and the coupling frequency is 479.4370 nm so that electrons are excited to the $84^{th}$ Rydberg state.

The Rydberg-atom based RF receiver 110 also includes a dual-polarised patch antenna 117 and photovoltaic photodiode 119 (such as an Indium Gallium Arsenide (InGaAs) photodiode). The photovoltaic photodiode 119 receives the first and second optical signals from the first and second optical fibres 151, 153 which, in this example, are phase correlated continuous waves separated in frequency by 3.58894 GHz. The photovoltaic photodiode 119 utilises an optical heterodyne technique to act as an optical mixer to obtain a photocurrent from the input first and second optical signals. In other words, the photovoltaic photodiode 119 may operate in photovoltaic mode in order to generate a voltage from the first and second optical signals, without any electrical power source. The frequency of the photocurrent is equal to the frequency difference between the first and second optical signals (that is, 3.58894 GHz). This photocurrent drives the patch antenna array to produce a local oscillator RF signal, having the same frequency as the photocurrent (that is, 3.58894 GHz) and a flat dual-polarised radiation pattern.

The dual-polarised patch antenna 117 is configured to transmit the local oscillator RF field through the transmission medium 115. The local oscillator signal and the wireless phase-modulated signals transmitted by the signal transmitter 130 both have a frequency corresponding with the transition from the predetermined Rydberg state to the other Rydberg state. In this example, the frequency of the wireless phase-modulated signal is on resonance with this transition, and the frequency of the local oscillator signal is slightly off-resonance with this transition. The superposition of the local oscillator signal and the wireless phase-modulated signal at the transmission medium 115 modifies the probe signal such that the phase and amplitude of the wireless phase-modulated signal can be detected at the photodetector 129. This detection technique has been discussed in several papers, such as "A Rydberg Atom-Based Mixer: Measuring the Phase of a Radio Frequency Wave", Matthew T. Simons et al., and "Detecting and Receiving Phase Modulated Signals with a Rydberg Atom-Based Mixer", Christopher L. Holloway et al. In brief, the combination of the probe and coupling signals in the transmission medium 115 excites electrons to the predetermined Rydberg state, creating an EIT effect. As the wireless phase-modulated signal further excites these electrons to another Rydberg state, a phenomenon known as Autler-Townes (AT) splitting is experienced in the transmission medium 115. The interference of the local oscillator signal and the wireless phase-modulated signal at the transmission medium 115 can then be detected by its effect on the EIT/AT splitting. That is, the probe signal is modulated by the interference between the local oscillator signal and the wireless phase-modulated signal. If one of these signals is detuned from the other signal, then the modulation depth of the EIT signal in the probe signal (that is, the difference in the probe signal when the wireless phase-modulated signal is incident at the transmission medium 115 and when the wireless phase-modulated signal is not incident at the transmission medium 115) is modulated in time by a beat note (also known as the "intermediate frequency") that varies in time by the frequency difference between the local oscillator signal and the wireless phase-modulated signal. The phase difference between the local oscillator signal and the wireless phase-modulated signal can then be measured as the phase of this beat note.

A brief overview of the theory behind this detection technique will now be presented.

The total electric field, $E_{atoms}$, experienced by the atomic medium transmission medium 115 is the sum of the electric field of the local oscillator signal, $E_1$, and the electric field of the wireless phase-modulated signal from the signal transmitter 130, $E_2$:

$$E_{atoms} = E_1 + E_2 \quad (1)$$

The electric field strength of the local oscillator signal and the electric field strength of the wireless phase-modulated signal may be defined as:

$$E_1 = E_{LO}\cos(\omega_{LO}t + \phi_{LO}) \quad (2)$$

$$E_2 = E_{SIG}\cos(\omega_{SIG}t + \phi_{SIG}) \quad (3)$$

In which:

$E_{LO}$ and $E_{SIG}$ represent the maximum electric field strengths of the local oscillator signal and the wireless phase-modulated signal respectively, $\omega_{LO}$ and $\omega_{SIG}$ represent the angular frequencies of the local oscillator signal and the wireless phase-modulated signal respectively, t represents time, and $\phi_{LO}$ and $\phi_{SIG}$ represent the phases of the local oscillator signal and the wireless phase-modulated signal respectively.

As the difference between the frequency of the local oscillator signal and the frequency of the wireless phase-modulated signal is much less than an average of these frequencies (i.e. $(\omega_{LO}+\omega_{SIG})/2$), then the total electric field may be expressed as:

$$E_{atoms} = \cos(\omega_{LO} + \phi_{LO}) \cdot \sqrt{E_{LO}^2 + E_{SIG}^2 + 2E_{LO}E_{SIG}\cos(\Delta\omega t + \Delta\phi)} \quad (4)$$

In which:

$\Delta\omega$ is the difference between the angular frequency of the local oscillator signal and the angular frequency of the wireless phase-modulated signal (i.e. $\omega_{LO}-\omega_{SIG}$), and $\Delta\phi$ is the difference between the phase of the local oscillator signal and the phase of the wireless phase-modulated signal (i.e. $\phi_{LO}-\phi_{SIG}$).

The Rudbium-85 atoms of the transmission medium 115 demodulate the high frequency field, $\omega_{LO}$, such that the received probe signal, $T_{probe}$, as a function of time is given by:

$$T_{probe} \propto |E_{atoms}| \cong E_{LO} + E_{SIG}\cos(\Delta\omega t + \Delta\phi) \quad (5)$$

The received probe signal therefore has a sinusoidal form with a frequency being the difference between the frequency of the local oscillator signal and the frequency of the wireless signal ($\Delta\omega$) and a phase being the difference between the phase of the local oscillator signal and the phase of the wireless signal ($\Delta\phi$). Accordingly, by measuring the relative phase shift of the received probe signal over time, the phase state of the wireless phase-modulated signal can be determined. Furthermore, an amplitude of the probe signal is a function of both the electric field strength of the local oscillator signal and the electric field strength of the wireless phase-modulated signal, such that the amplitude of the wireless phase-modulated signal may be determined from the amplitude of the received probe signal. In more detail, for modulation schemes that utilise a plurality of amplitudes (in addition to phase) to identify a symbol, then each distinct amplitude of the plurality of amplitudes as transmitted by the signal transmitter 130 causes a distinct amplitude in the received probe signal.

The response of the photodetector 129 to the wireless phase-modulated signal scales in proportion to both $E_{LO}$ and $E_{SIG}$ so a stronger local oscillator signal compensates for a weaker wireless phase-modulated signal (but any noise power in the local oscillator signal must be kept below the power of the wireless phase-modulated signal).

Advantageously, the Rydberg-atom based RF receiver 110 produces a local oscillator signal for detecting phase-modulated RF signals without any active electronics. In conventional Rydberg-atom based RF receivers configured for detecting phase-modulated signals, the local oscillator signal is produced by an antenna driven by a local signal generator. The local signal generator is an active electronic device such that the conventional Rydberg-atom based RF receiver requires an electrical power source. In contrast, the Rydberg-atom based RF receiver described herein generates the local oscillator signal by driving an antenna with a photocurrent derived from optical signals from external, remote optical sources. No electrical power source is therefore required in generating the local oscillator signal, such that the Rydberg-atom based RF receiver for phase-modulated signals may be used in an electrically passive deployment.

The local oscillator signal and the wireless phase-modulated signal are phase synchronised. As noted above, the signal transmitter 130 is configured to synchronise with a network-distributed synchronisation signal which is broadcast by a base station of the cellular telecommunications network. The optical equipment housing 120 includes a cellular telecommunications receiver configured to receive the same network-distributed synchronisation signals. The first and second optical signals are thereafter synchronised to these synchronisation signals and therefore synchronised with the wireless phase-modulated signals transmitted by the signal transmitter 130.

Figure 2:
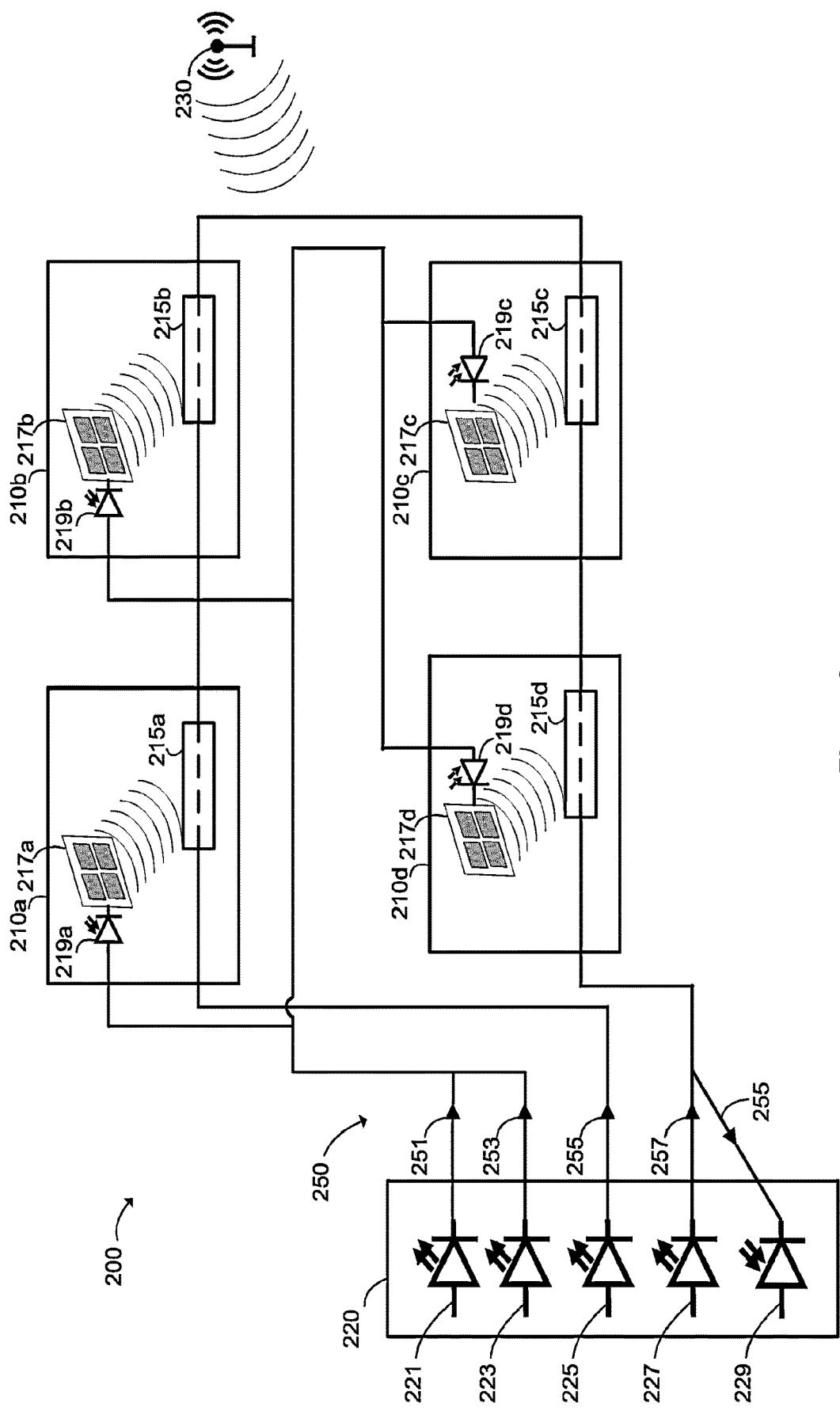
FIG. 2 is a schematic diagram illustrating a Rydberg-atom based RF detector array.

FIG. 2 illustrates a wireless telecommunications network 200. The wireless telecommunications network 200 includes a Rydberg-atom based RF receiver array 210, an optical equipment housing 220 and a signal transmitter 230. The Rydberg-atom based RF receiver array 210 includes a plurality of elements 210a, 210b, 210c, 210d, each of which includes one or more optical fibre interfaces, a transmission medium 215a, 215b, 215c, 215d, a dual-polarised patch antenna 217a, 217b, 217c, 217d, and a photovoltaic photodiode 219a, 219b, 219c, 219d.

As shown in FIG. 2, the optical equipment housing 220 includes optical sources for generating the first optical signal, second optical signal, probe signal and coupling signal (as described above in relation to FIG. 1). These signals are launched onto a first optical fibre 251, a second optical fibre 253, a third optical fibre 255 and a fourth optical fibre 257 respectively (collectively, a plurality of optical fibres 250).

The plurality of optical fibres 250 communicate these optical signals to each element of the Rydberg-atom based RF receiver array 210. Each element of the Rydberg-atom based RF receiver array 210 receives a respective fraction of the first optical signal and second optical signal. This is achieved by splitting off a fraction of the power of the first optical signal from the first optical fibre 251 to the respective optical fibre interface of each element of the Rydberg-atom based RF receiver array 210 and similarly splitting off a fraction of the power of the second optical signal from the second optical fibre 253 to the respective optical fibre interface of each element of the Rydberg-atom based RF receiver array 210. These first and second optical signals may then be utilised (as described in relation to FIG. 1 above) by each photovoltaic photodiode 219a, 219b, 219c, 219d to generate a photocurrent, which is in turn used to generate a local oscillator signal by each respective dual-polarised patch antenna 217a, 217b, 217c, 217d, which is then transmitted to each respective transmission medium 215a, 215b, 215c, 215d.

The power of the first and second optical signals generated at the optical equipment housing 220 is configured to ensure that equal and sufficient optical power is received at each element of the Rydberg-atom based RF receiver array 210 to produce an equally strong local oscillator signal at each transmission medium.

Furthermore, each element of the Rydberg-atom based RF receiver array 210 receives the probe signal from the third optical fibre 255 and the coupling signal from the fourth optical fibre 257. These are communicated serially to each element of the Rydberg-atom based RF receiver array 210 such that the probe signal passes through the first element, then the second element, then the third element and then the fourth element of the Rydberg-atom based RF receiver array 210, and the coupling signal counter-propagates and overlaps the probe signal in each transmission medium by passing through the fourth element, then the third element, then the second element, and then the first element of the Rydberg-atom based RF receiver array 210. The probe and coupling signals therefore (as described in relation to FIG. 1 above) excite electrons of each transmission medium 215a, 215b, 215c, 215d to the predetermined Rydberg state.

The power of the probe and coupling signals generated at the optical equipment housing 220 is configured to ensure that equal and sufficient optical power is received at each element of the Rydberg-atom based RF receiver array 210 to elevate sufficient electrons of each transmission medium 215a, 215b, 215c, 215d to the predetermined Rydberg state to detect a wireless phase-modulated signal from the signal transmitter 230.

In this configuration, each transmission medium 215a, 215b, 215c, 215d may receive a combination of the wireless phase-modulated signal and the local oscillator signal and cause a change in the probe signal from which the phase-state of the wireless phase-modulated signal may be detected (again, as described in relation to FIG. 1 above). As the probe signal passes through each element of the Rydberg-atom based RF receiver array 210 sequentially, then the change in the probe signal indicates the detection of the wireless phase-modulated signal at any one of the elements of the Rydberg-atom based RF receiver array 210.

The Rydberg-atom based RF receiver array 210 therefore enables electrically passive detection of phase-modulated signals at multiple locations with the additional benefit of sharing the relatively expensive optical sources.

Figure 3:
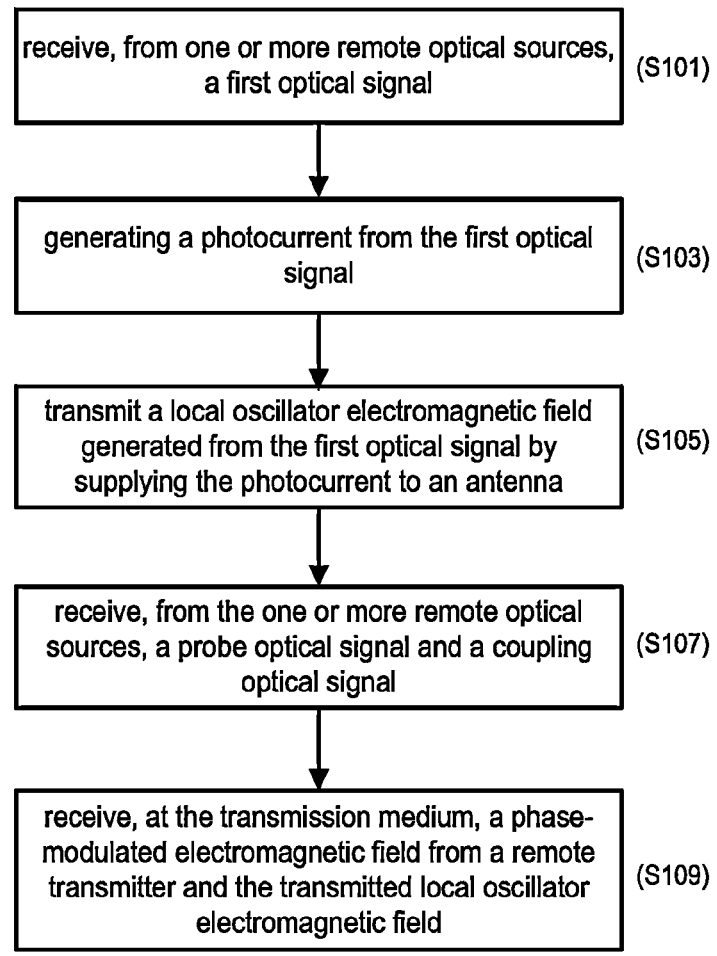
FIG. 3 is a flow diagram illustrating a method of operating the Rydberg-atom based RF detector of FIG. 1 or the Rydberg-atom based RF detector array of FIG. 2.

FIG. 3 is a flow diagram to illustrate operation of the Rydberg-atom based RF receiver 110 of FIG. 1 or the Rydberg-atom based RF receiver array 210 of FIG. 2. In step S101, the Rydberg-atom based RF receiver (or array) receives, from one or more remote optical sources, a first optical signal. In step S103, the Rydberg-atom based RF receiver (or array) generates a photocurrent from the first optical signal. In step S105, the Rydberg-atom based RF receiver (or array) transmits a local oscillator electromagnetic field generated from the first optical signal by supplying the photocurrent to an antenna. In step S107, the Rydberg-atom based RF receiver (or array) receives, from the one or more remote optical sources, a probe optical signal and a coupling optical signal, wherein the transmission medium is excited by the probe optical signal having a probe frequency set to excite electrons of the transmission medium to a first excited state, and wherein the transmission medium is further excited by the coupling optical signal having a coupling frequency set to excite electrons of the transmission medium to a predetermined Rydberg state so as to induce an Electromagnetic Induced Transparency, EIT, effect. In step S109, the Rydberg-atom based RF receiver (or array) receives, at the transmission medium, a phase-modulated electromagnetic field from a remote transmitter and the transmitted local oscillator electromagnetic field such that the combination of the phase-modulated electromagnetic field and the transmitted local oscillator electromagnetic field causes a change in the probe optical signal from which a phase state of the phase-modulated electromagnetic field can be detected.

As noted above, a dual-polarised patch antenna is used to generate the local oscillator field. The skilled person will understand that this is non-essential, and other antenna designs (such as a dipole antenna) may be used instead. However, the dual-polarised patch antenna is preferable as it produces a local oscillator signal having two orthogonal polarisations and a near-plane wave radiation pattern—ensuring mixing of the local oscillator signal and the wireless phase-modulated signal from the signal generator regardless of the polarisation of the wireless phase-modulated signal. In contrast, a dipole antenna design produces a local oscillator signal having a single polarisation aligned with the dipole antenna's axis which may be orthogonal to the polarisation of the wireless phase-modulated signal—thus reducing mixing.

As noted above, the phases of the local oscillator signal and the wireless phase-modulated signal are synchronised by the optical equipment housing and signal transmitter by synchronising these signals with a common network-distributed synchronisation signal. However, this is non-essential and other synchronisation methods may be used. For example, the system may implement a Precision Timing Protocol (PTP) technique in which the optical equipment housing further comprises a local master clock (e.g. an atomic clock), and provides synchronisation signals via the PTP protocol to the one or more signal transmitters within range of the optical equipment housing.

Furthermore, when utilising both a first and second optical signal, it is non-essential that these optical signals have wavelengths around 1550 nm. That is, these optical signals may have wavelengths within any of the optical fibre transmission bands, such as the O-band (1260-1360 nm), E-band (1360-1460 nm), S-band (1460-1530 nm), C-band (1530-1565 nm), L-band (1565-1625 nm), or U/XL-band (1625-1675 nm).

The skilled person will also understand that the Rydberg-atom based RF receiver (or array) may be used to detect electromagnetic signals of different frequencies. That is, for a particular target frequency to be detected, a system may be configured such that an EIT signal is produced on a probe signal by an incident electromagnetic signal at that target frequency to be detected, such as by selecting an appropriate atomic medium (e.g. Rubidium, Caesium or Strontium) having a Rydberg state that corresponds with that target frequency to be detected and selecting frequencies for the probe and coupling signals corresponding to that Rydberg state. Furthermore, it is also non-essential that the EIT signal is produced following a ladder configuration of electron transitions. That is, any configuration (e.g. Lambda, Vee) may be used. It is also non-essential that the transmission medium is a glass-filled cavity as an optical cavity of an optical fibre may be used instead. It is also non-essential that the optical equipment housing uses one or more lasers to produce the probe and coupling signals. That is, any other optical transmitter or coherent optical transmitter may be used instead (such as a Light Emitting Diode).

As noted above, the driving current for the antenna transmitting the local oscillator signal was generated by mixing a first and second optical signal using an optical heterodyne technique so as to generate a photocurrent at the target frequency of the local oscillator signal. This is beneficial as the first and second optical signals may have respective wavelengths within the low-attenuation bands of conventional optical fibre (e.g. around 1550 nm in FIGS. 1 and 2 above) but separated in frequency by an amount equal to the target frequency of the local oscillator signal. However, this is non-essential. That is, a single optical signal—having a frequency equal to the target frequency of the local oscillator signal—may be received at the Rydberg-atom based RF receiver (or element of the Rydberg-atom based RF receiver array) and used to generate the local oscillator signal at that frequency. This may require specialist optical fibre for communicating the single optical signal from the remote optical equipment housing to the Rydberg-atom based RF receiver (or element of the Rydberg-atom based RF receiver array), such as a hollow core fibre, to limit the attenuation loss of the single optical signal. Alternatively, the single optical signal may be intensity modulated at the target frequency, which may then be utilised by the Rydberg-atom based RF receiver (or element of the array) to generate the local oscillator signal. However, these techniques are more prone to noise than the optical heterodyne technique utilising the first and second optical signals described above.

The phase noise of the first and second optical signals is reduced by locking the first and second optical sources to an optical cavity or frequency comb. However, this is non-essential and other methods of reducing the phase noise may be used. For example, the phases of the first and second optical sources may be correlated using an electro-optic modulator or acousto-optic modulator. In another example, the phases of the first and second optical sources may be locked by frequency offset locking, such as by mixing the first and second optical signals and measuring the heterodyne signal between them.

Furthermore, it is also non-essential that the optical sources are contained in a single optical equipment housing. That is, the optical sources may be distributed. It is also non-essential that the Rydberg-atom based RF receiver (or element of the array) is embodied in a single unit. That is, the photovoltaic photodiode and antenna may be embodied in a first module and the transmission medium may be embodied in a second module of the Rydberg-atom based RF receiver (or element of the array), and these first and second modules may be separated so long as the local oscillator signal transmitted by the antenna of the first module is of sufficient strength at the transmission medium of the second module.

In FIG. 2, each element of the Rydberg-atom based RF receiver array includes a photovoltaic photodiode and an antenna for generating and transmitting the local oscillator signal to the transmission medium of that element. However, in the alternative arrangement noted above in which the photovoltaic photodiode and antenna are provided in a first module and the transmission medium may be provided in a second module, then each first module may be configured to generate and transmit a local oscillator signal to transmission media of a plurality of second modules in the array. That is, it is non-essential that there is a one-to-one mapping of first modules to second modules, and a one-to-many mapping of first modules to second modules may be implemented instead. This may be suitable when a plurality of second modules are in close proximity such that the local oscillator signal may be transmitted from a single first module with sufficient strength at the transmission media of each second module. This has the additional benefit of reducing the number of photovoltaic photodiodes and antennas in the array.

The Rydberg-atom based RF receiver of FIG. 1 and the array of FIG. 2 are configured to detect wireless signals modulated using a 16-QAM modulation scheme. However, the skilled person will understand that other phase-modulation schemes, such as Binary Phase Shift Keying (BPSK), Quadrature Phase Shift Keying (QPSK), or a higher order of QAM, may be used instead.

In the Rydberg-atom based RF receiver of FIG. 1 and the array of FIG. 2, the frequency difference between the local oscillator signal and the wireless phase-modulated signal is 30 kHz. However, this particular frequency difference is non-essential. The response time of the Rubidium-85 atoms in the transmission medium 115 to the wireless phase-modulated signal is limited by the spontaneous lifetime of the first excited state to the range of 1 MHz to 10 MHz. Ideally therefore, the frequency difference between the local oscillator signal and the wireless phase-modulated signal should be less than 10 MHz. If not, the atomic response to the wireless phase-modulated signal will be reduced and the Rydberg-atom based RF receiver may not accurately detect the correct relative phase. Furthermore, it is also non-essential that the local oscillator signal is off-resonance with the atomic transition between the predetermined Rydberg state and the other Rydberg state and the wireless phase-modulated signal is on-resonance with the atomic transition between the predetermined Rydberg state and the other Rydberg state. Alternatively, the local oscillator signal may be on-resonance with the atomic transition between the predetermined Rydberg state and the other Rydberg state and the wireless phase-modulated signal may be off-resonance with the atomic transition between the predetermined Rydberg state and the other Rydberg state. The local oscillator signal and wireless phase-modulated signal may both be off-resonance with the atomic transition between the predetermined Rydberg state and the other Rydberg state.

Furthermore, it is also non-essential that the Rydberg-atom based RF receiver (or array) acts as a receiver (that is, demodulate data from the phase states of a series of wireless phase-modulated signals). That is, the device may be operated merely to detect the phase state of one or more wireless phase-modulated signals. In other words, the device of FIG. 1 may be a Rydberg-atom based RF detector and the device of FIG. 2 may be a Rydberg-atom based RF detector array.

The skilled person will understand that any combination of elements is possible within the scope of the invention, as claimed.

The invention claimed is:

1. An electromagnetic field detector comprising:
a first optical signal interface configured to receive, from one or more remote optical sources, a first optical signal;
an electromagnetic field transmitter configured to transmit a local oscillator electromagnetic field generated from the first optical signal, the electromagnetic field transmitter comprising:
a photocurrent generator configured to generate a photocurrent from the first optical signal; and
an antenna interface configured to supply the photocurrent to an antenna to transmit the local oscillator electromagnetic field;
a second optical signal interface configured to receive, from the one or more remote optical sources, a probe optical signal and a coupling optical signal; and
a transmission medium configured to be excited by the probe optical signal and further excited by the coupling optical signal, wherein the probe optical signal has a probe frequency set to excite electrons of the transmission medium to a first excited state and the coupling optical signal has a coupling frequency set to excite electrons of the transmission medium to a predetermined Rydberg state so as to induce an Electromagnetic Induced Transparency, EIT, effect,
wherein the transmission medium is further configured to receive a phase-modulated electromagnetic field from a remote transmitter and the local oscillator electromagnetic field such that the combination of the phase-modulated electromagnetic field and the local oscillator electromagnetic field causes a change in the probe optical signal from which a phase state of the phase-modulated electromagnetic field can be detected.

2. An electromagnetic field detector as claimed in claim 1, wherein the first optical signal interface is further configured to receive a second optical signal from the one or more remote optical sources, and the photocurrent generator is configured to generate the photocurrent by mixing the first and second optical signals.

3. An electromagnetic field detector as claimed in claim 1, wherein the local oscillator electromagnetic field and the phase-modulated electromagnetic field are synchronised.

4. An electromagnetic field detector as claimed in claim 1, wherein the first optical signal has a wavelength in one of the O-band, E-band, S-band, C-band, L-band, and U/XL-band.

5. An electromagnetic field detector as claimed in claim 2, wherein the second optical signal has a wavelength in one of the O-band, E-band, S-band, C-band, L-band, and U/XL-band.

6. An electromagnetic field detector as claimed in claim 1, wherein the local oscillator electromagnetic field is dual-polarised.

7. An electromagnetic field detector as claimed in claim 1, further comprising:
a first module comprising the first optical signal interface and the electromagnetic field transmitter; and
a second module comprising the second optical signal interface and the transmission medium.

8. An electromagnetic field detector as claimed in claim 7, wherein the first module and second module are either embodied in a single housing or embodied in respective housings.

9. An electromagnetic field detector as claimed in either claim 7, wherein the second module is one of a plurality of second modules, each second module comprising:
a respective second optical signal interface configured to receive, from the one or more remote optical sources, the probe optical signal and the coupling optical signal, and
a respective transmission medium configured to be excited by the probe optical signal and further excited by the coupling optical signal, wherein the probe optical signal has a probe frequency set to excite electrons of the transmission medium to a first excited state and the coupling optical signal has a coupling frequency set to excite electrons of the respective transmission medium to a predetermined Rydberg state so as to induce an Electromagnetic Induced Transparency, EIT, effect,
wherein the respective transmission medium is further configured to receive a phase-modulated electromagnetic field from the remote transmitter and the local oscillator electromagnetic field from the electromagnetic field transmitter of the first module such that the combination of the phase-modulated electromagnetic field and the local oscillator electromagnetic field causes a change in the probe signal from which a phase state of the phase-modulated electromagnetic field can be detected.

10. An electromagnetic field detector as claimed in claim 9, wherein the first module is one of a plurality of first modules, each first module comprising:
   a respective first optical signal interface configured to receive, from the one or more remote optical sources, the first optical signal, and
   a respective electromagnetic field transmitter configured to transmit a local oscillator electromagnetic field generated from the first optical signal,
   wherein each first module of the plurality of first modules is associated with a second module of the plurality of second modules such that the local oscillator electromagnetic field transmitted by the respective electromagnetic field transmitter of that first module is received at the transmission medium of the associated second module.

11. A system comprising:
   an electromagnetic field detector as claimed in claim 1;
   one or more optical sources, remote from the electromagnetic field detector, configured to generate the first optical signal, the probe optical signal and the coupling optical signal, and communicate the first optical signal, probe optical signal and coupling optical signal to the electromagnetic field detector.

12. A system as claimed in claim 11, being part of a telecommunications network, wherein the one or more optical sources is configured to receive a network-distributed synchronisation signal, and the one or more optical sources is configured to synchronise the first optical signal based on the synchronisation signal.

13. A system as claimed in claim 12, wherein the phase-modulated electromagnetic field is synchronised with the network-distributed synchronisation signal.

14. A system as claimed in claim 11, further comprising a master clock and a transmitter configured to communicate a synchronisation signal, derived from the master clock, to the remote transceiver, wherein the first optical signal is synchronised to the synchronisation signal.

15. A system as claimed in claim 11, further comprising an optical telecommunications network, wherein the first optical signal, probe optical signal and coupling optical signal are communicated to the electromagnetic field detector via the optical telecommunications network.

16. A method of operating an electromagnetic field detector, the electromagnetic detector having a transmission medium, the method comprising the steps of:
   receiving, from one or more remote optical sources, a first optical signal;
   generating a photocurrent from the first optical signal;
   transmitting a local oscillator electromagnetic field generated from the first optical signal by supplying the photocurrent to an antenna;
   receiving, from the one or more remote optical sources, a probe optical signal and a coupling optical signal, wherein the transmission medium is excited by the probe optical signal having a probe frequency set to excite electrons of the transmission medium to a first excited state, and wherein the transmission medium is further excited by the coupling optical signal having a coupling frequency set to excite electrons of the transmission medium to a predetermined Rydberg state so as to induce an Electromagnetic Induced Transparency, EIT, effect; and
   receiving, at the transmission medium, a phase-modulated electromagnetic field from a remote transmitter and the transmitted local oscillator electromagnetic field such that the combination of the phase-modulated electromagnetic field and the transmitted local oscillator electromagnetic field causes a change in the probe optical signal from which a phase state of the phase-modulated electromagnetic field can be detected.

17. A method as claimed in claim 16, further comprising the step of:
   receiving, from the one or more optical sources, a second optical signal,
   wherein the step of generating the local oscillator electromagnetic field further comprises mixing the first and second optical signals to generate the photocurrent.

18. A method as claimed in claim 15, wherein the electromagnetic field detector is an element of an electromagnetic field detector array, each element of the electromagnetic field detector array having a transmission medium, wherein the transmission medium of each element of the electromagnetic field detector array is excited by the probe optical signal and further excited by the coupling optical signal so as to induce the EIT effect in the transmission medium of each element of the electromagnetic field detector array, wherein the method further comprises the steps of:
   receiving, at the transmission medium of each element of the electromagnetic field detector array, a phase-modulated electromagnetic field from the remote transmitter and the transmitted local oscillator electromagnetic field such that the combination of the phase-modulated electromagnetic field and the transmitted local oscillator electromagnetic field causes a change in the probe optical signal from which a phase state of the phase-modulated electromagnetic field can be detected.

* * * * *